(12) United States Patent
Liang et al.

(10) Patent No.: US 9,169,117 B1
(45) Date of Patent: Oct. 27, 2015

(54) MEMS DEVICE AND METHOD OF FORMING THE SAME

(71) Applicant: Taiwan Semiconductor Manufacturing Company Limited, Hsinchu (TW)

(72) Inventors: Chin-Wei Liang, Hsinchu County (TW); Cheng-Yuan Tsai, Hsin-Chu county (TW); Chia-Shiung Tsai, Hsin-Chu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/261,842

(22) Filed: Apr. 25, 2014

(51) Int. Cl.
H01L 21/30 (2006.01)
H01L 21/46 (2006.01)
B81C 1/00 (2006.01)
B81B 7/00 (2006.01)

(52) U.S. Cl.
CPC ............ *B81C 1/00285* (2013.01); *B81B 7/0038* (2013.01); *B81C 1/0038* (2013.01)

(58) Field of Classification Search
CPC ..................... H01L 21/02606; H01L 21/0262; H01L 21/02603; H01L 21/3223; H01L 21/3225; H01L 21/8238; H01L 27/0922; H01L 21/02126; H01L 21/0252
USPC ......... 438/52, 54, 55, 99, 199, 456, 502, 509; 257/E21.006, E21.077, E21.212, 257/E21.262, E21.27, E21.305, E21.319, 257/E21.324, E21.485, 40, 52, 55, 56
See application file for complete search history.

(56) References Cited

U.S. PATENT DOCUMENTS

| | | | | |
|---|---|---|---|---|
| 6,803,840 | B2 * | 10/2004 | Hunt et al. | 333/186 |
| 8,040,038 | B2 * | 10/2011 | Brunetti et al. | 313/495 |
| 2004/0169458 | A1 * | 9/2004 | Fran et al. | 313/495 |
| 2014/0321026 | A1 * | 10/2014 | Hermann et al. | 361/502 |

* cited by examiner

*Primary Examiner* — David Nhu
(74) *Attorney, Agent, or Firm* — Jones Day

(57) ABSTRACT

According to an exemplary embodiment, a method of forming a Micro Electro Mechanical System (MEMS) device is provided. The method includes the following operations: providing a substrate; forming a catalyst layer over the substrate; patterning the catalyst layer; forming a carbon nanotube based on the catalyst layer; forming a getter layer over the carbon nanotube and the substrate; and etching back the getter layer to expose the carbon nanotube. According to an exemplary embodiment, a method of forming a MEMS device is provided. The method includes the following operations: providing a substrate; forming a catalyst island over the substrate; heating the substrate and the catalyst island; contacting the catalyst island with a carbon-containing gas to form a carbon nanotube; forming a getter layer over the carbon nanotube and the substrate; and etching back the getter layer to expose the carbon nanotube.

20 Claims, 13 Drawing Sheets

1300

MEMS DEVICE AND METHOD OF FORMING THE SAME

BACKGROUND

CMOS-compatible MEMS packaging is widely used nowadays. However, combinations of CMOS technology and MEMS may cause an out-gassing issue. The subsequent pressure level shift within the MEMS device induced by the out-gassing issue may degrade the performance of the devices. Therefore, there is a need to eliminate the issue and enhance the performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
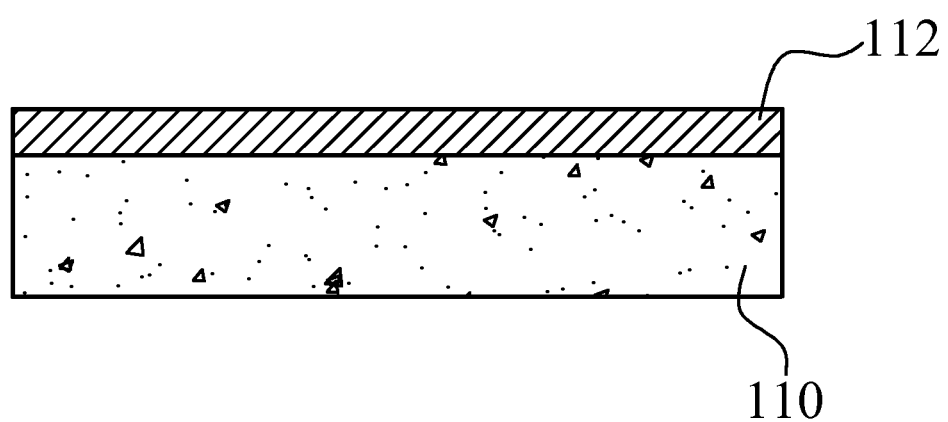
FIG. 1 is a sectional view illustrating an exemplar MEMS device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The disclosure describes a method of forming a MEMS device. This disclosure also provides a MEMS device and a method of forming a MEMS device. The disclosure utilizes chemical vapor deposition (CVD) process to form a plurality of patterned carbon nanotubes (CNT) as backbone and then deposits getter formed of titanium among the patterned CNTs. We estimate that surface area and getter efficiency of the titanium getter among the CNTs substantially multiplies by about 2-10 times compared to the titanium getter being directed deposited over the silicon layer without the CNTs therebetween.

FIG. 1 is a sectional view illustrating an exemplar MEMS device in accordance with some embodiments. As shown in FIG. 1, a substrate 110 is provided. A catalyst layer 112 is formed over the substrate 110. The catalyst layer 112 is made of at least one of iron, cobalt and nickel.

Figure 2:
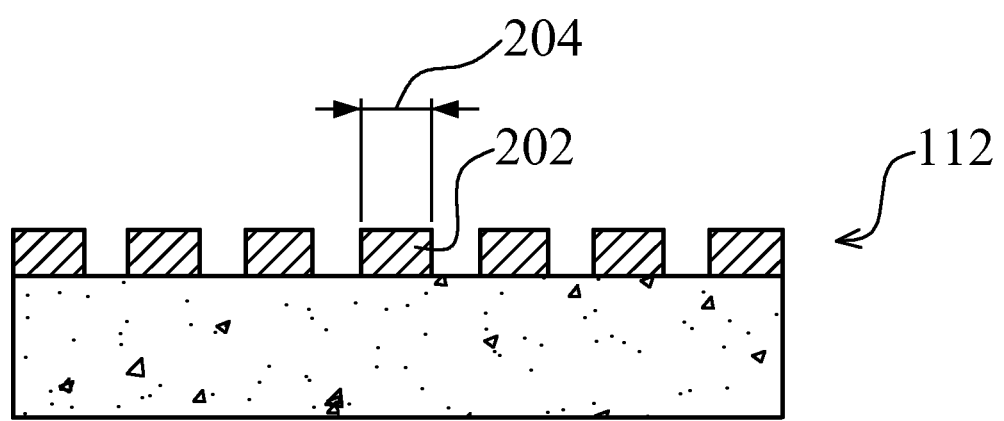
FIG. 2 is a sectional view illustrating the exemplar MEMS device in accordance with some embodiments.

FIG. 2 is a sectional view illustrating the exemplar MEMS device in accordance with some embodiments. As shown in FIG. 2, the catalyst layer 112 is patterned so as to form a catalyst island 202. The catalyst island 202 has a size 204 of, for example, about 100 nanometers to about 5 micrometers and has an area of, for example, about 100 square nanometers to about 25 square micrometers.

Figure 3:
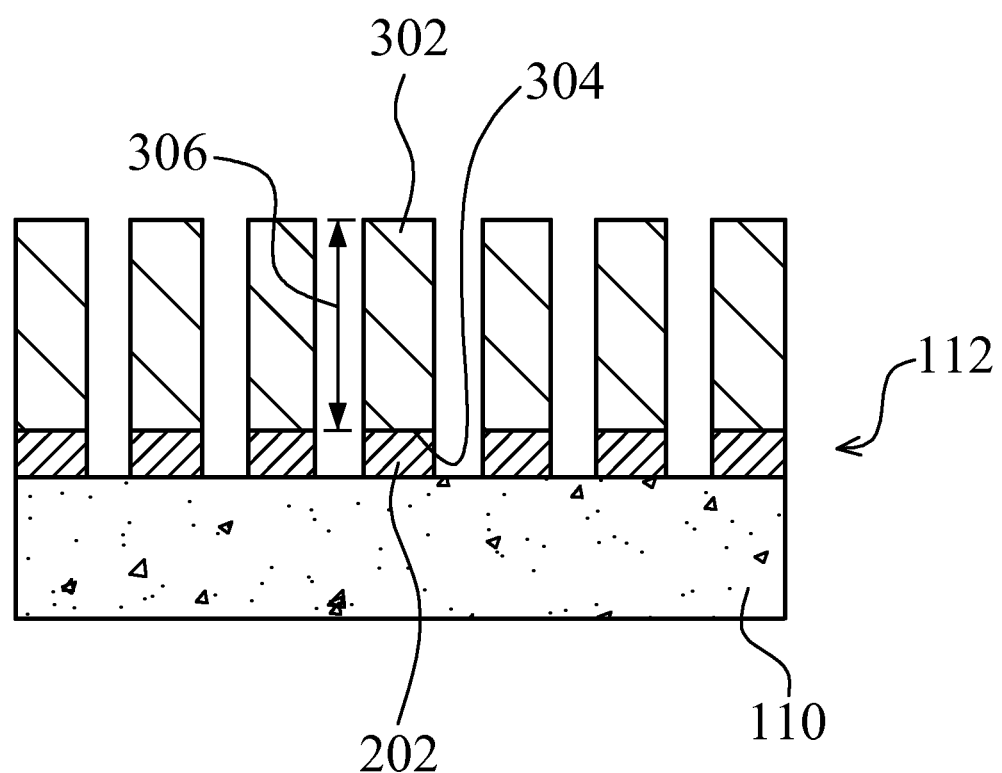
FIG. 3 is a sectional view illustrating the exemplar MEMS device in accordance with some embodiments.

FIG. 3 is a sectional view illustrating the exemplar MEMS device in accordance with some embodiments. As shown in FIG. 3, based on the catalyst island 202 of the catalyst layer 112, a carbon nanotube 302 is formed. During the growing process of the carbon nanotube 302, the substrate 110 and the catalyst layer 112 are heated, then carbon-containing gas contacts with the catalyst island 302 of the catalyst layer 112 to form the carbon nanotube 302. For example, methane and hydrogen gas may be applied to the process. The carbon nanotube 302 has a length 306 of, for example, about 100 nanometers to about 5 micrometers.

Additionally, the catalyst island 202 may stay at the tips of the growing carbon nanotube 302 during growth, or remain at the base of the growing carbon nanotube 302, depending on the adhesion between the catalyst island 202 and the substrate 110. In the embodiment, the catalyst island 202 remains at the base 304.

Figure 4:
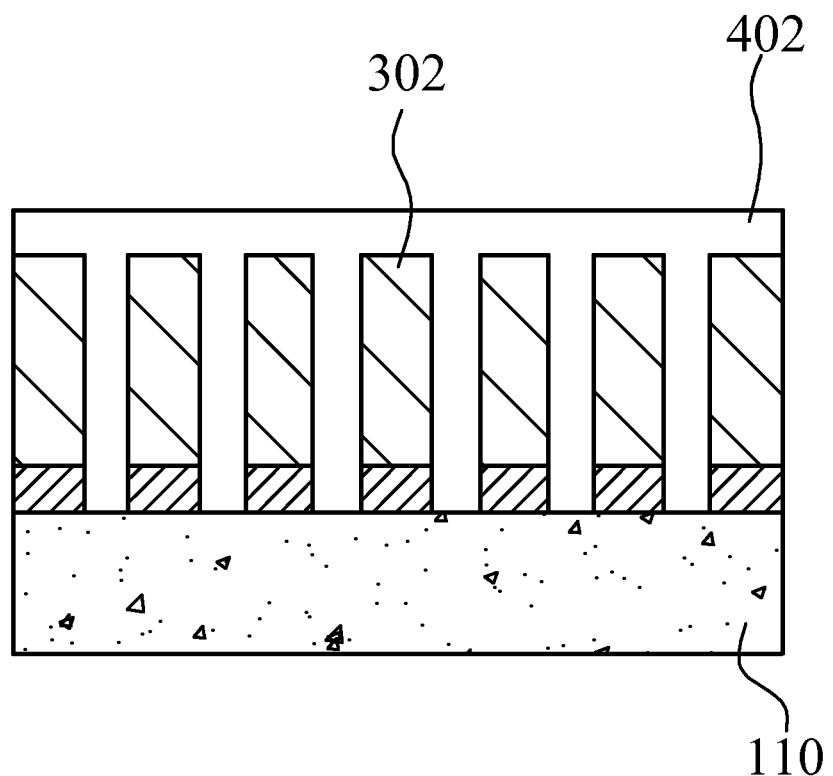
FIG. 4 is a sectional view illustrating the exemplar MEMS device in accordance with some embodiments.

FIG. 4 is a sectional view illustrating the exemplar MEMS device in accordance with some embodiments. As shown in FIG. 4, a getter layer 402 is formed over the carbon nanotube 302 and the substrate 110. The getter layer 402 may be made of titanium.

Figure 5:
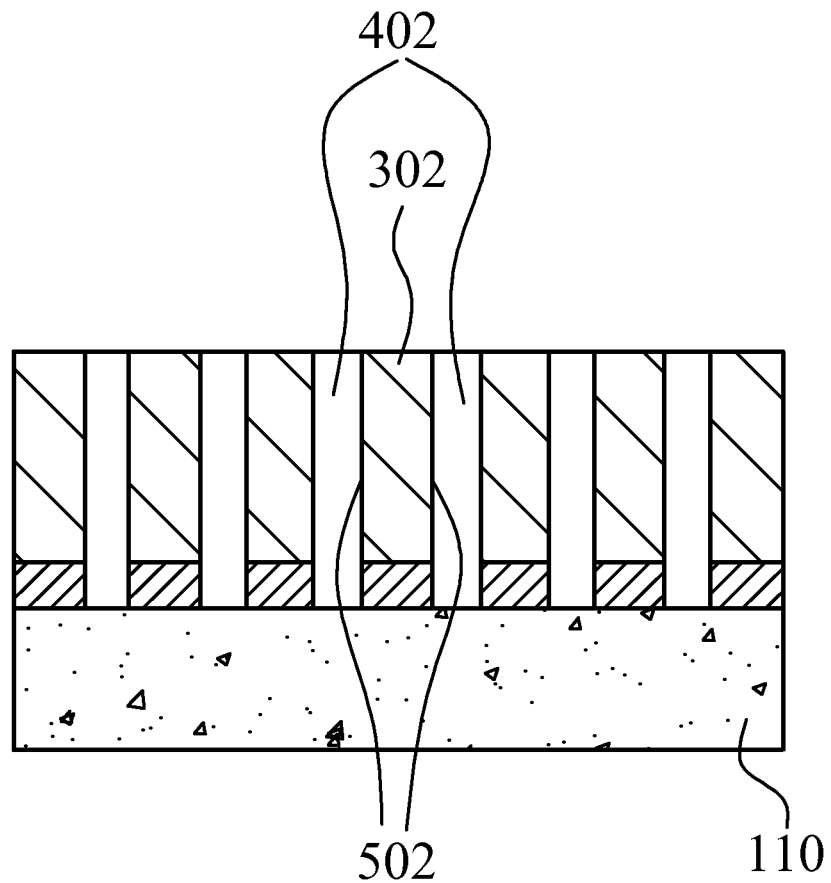
FIG. 5 is a sectional view illustrating the exemplar MEMS device in accordance with some embodiments.

FIG. 5 is a sectional view illustrating the exemplar MEMS device in accordance with some embodiments. As shown in FIG. 5, the getter layer 402 is etched back to expose the carbon nanotube 302. Therefore, a sidewall 502 of the getter layer 402 is made well-ventilated so as to increase surface area and efficiency of the getter layer 402. We estimate that surface area and getter efficiency of the getter layer 402 substantially multiplies by about 2-10 times compared to the getter layer being directed deposited over the substrate 110 without the carbon nanotube 302 therebetween.

Figure 6:
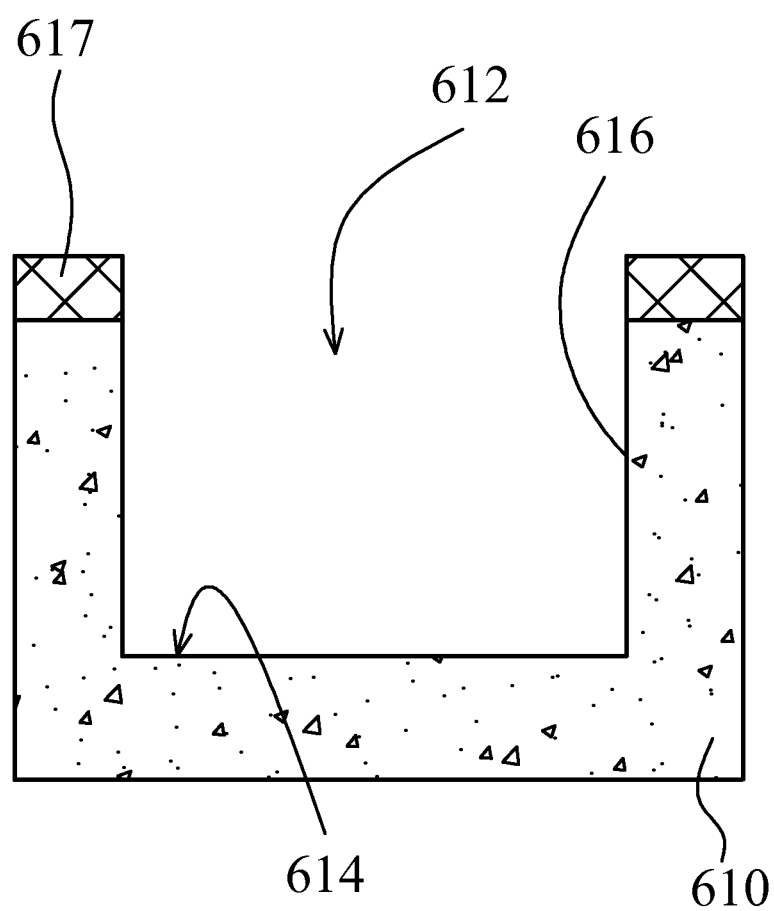
FIG. 6 is a sectional view illustrating an exemplar MEMS device in accordance with some embodiments.

FIG. 6 is a sectional view illustrating an exemplar MEMS device in accordance with some embodiments. As shown in FIG. 6, a substrate 610 is provided. In the substrate 610, a cavity 612 having a bottom surface 614 and a sidewall 616 is formed. Eutectic material 617 is formed over the substrate 610 for further wafer bonding.

Figure 7:
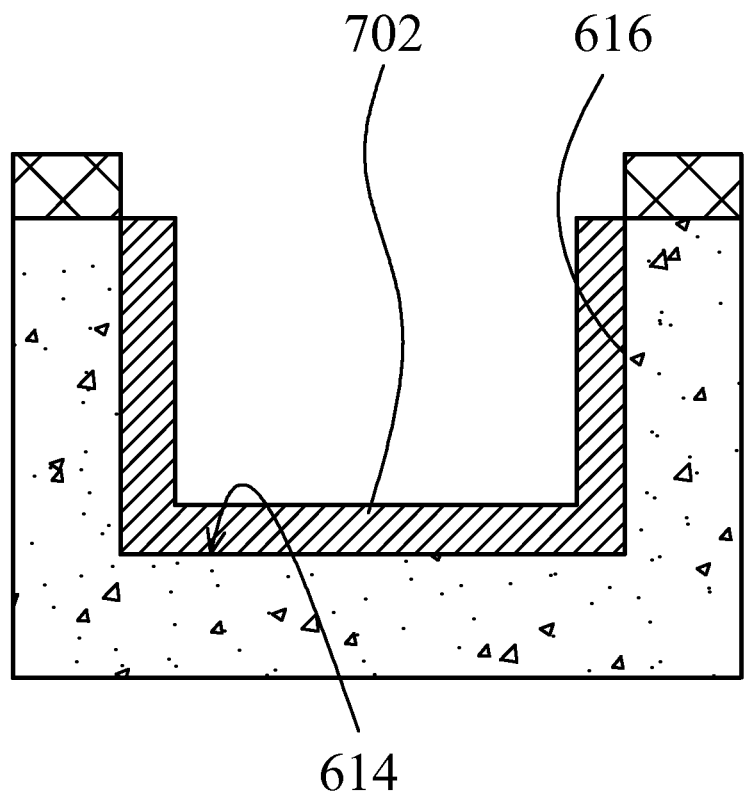
FIG. 7 is a sectional view illustrating the exemplar MEMS device in accordance with some embodiments.

FIG. 7 is a sectional view illustrating the exemplar MEMS device in accordance with some embodiments. As shown in FIG. 7, a catalyst layer 702 is formed over the bottom surface 614 and the sidewall 616 of the cavity 612.

Figure 8:
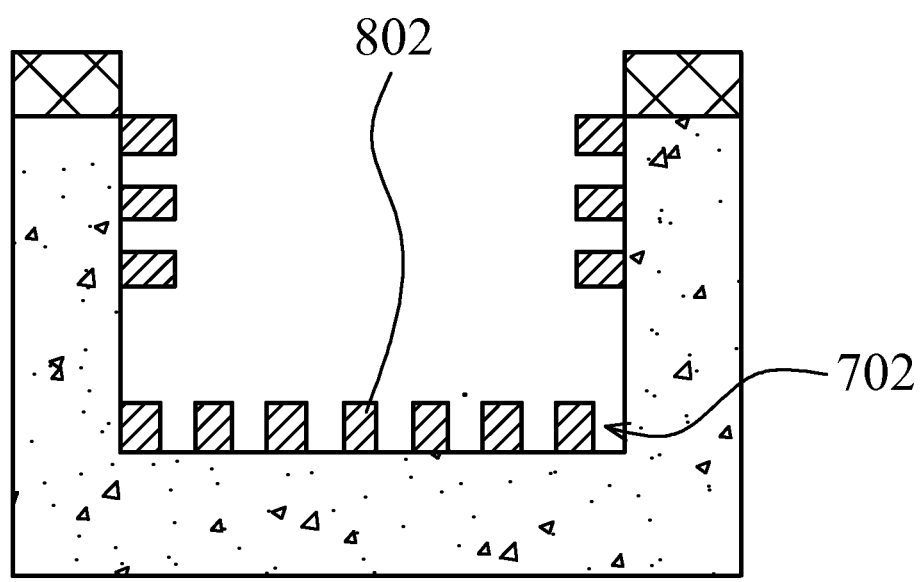
FIG. 8 is a sectional view illustrating the exemplar MEMS device in accordance with some embodiments.

FIG. 8 is a sectional view illustrating the exemplar MEMS device in accordance with some embodiments. As shown in FIG. 8, the catalyst layer 702 is patterned so as to form a catalyst island 802.

Figure 9:
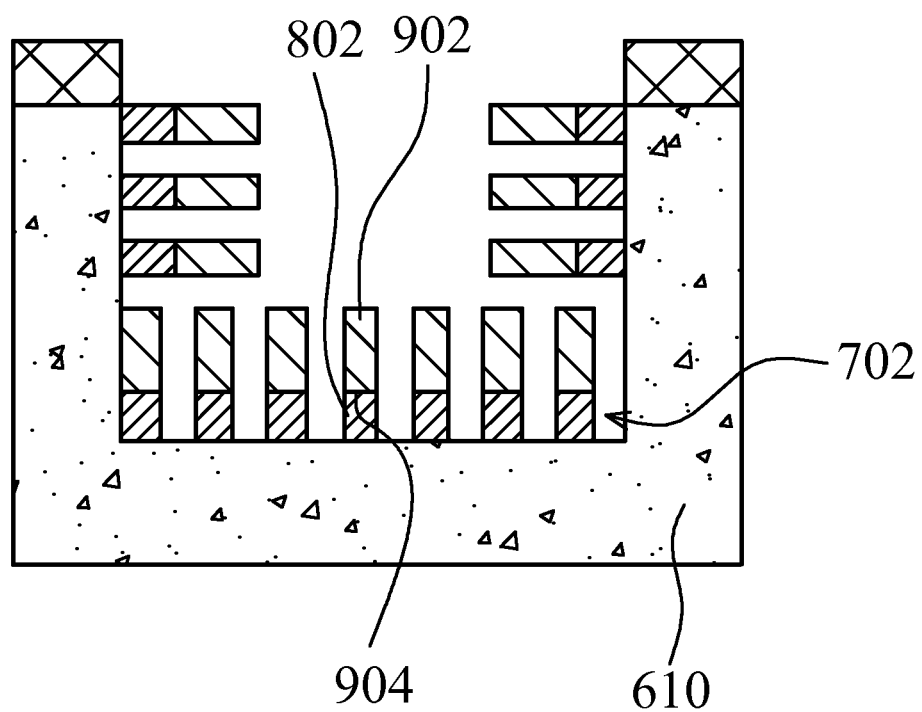
FIG. 9 is a sectional view illustrating the exemplar MEMS device in accordance with some embodiments.

FIG. 9 is a sectional view illustrating the exemplar MEMS device in accordance with some embodiments. As shown in FIG. 9, based on the catalyst island 802 of the catalyst layer 702, a carbon nanotube 902 is formed. During the growing process of the carbon nanotube 902, the substrate 610 and the catalyst layer 702 are heated, then carbon-containing gas contacts with the catalyst island 802 of the catalyst layer 702 to form the carbon nanotube 902. For example, methane and hydrogen gas may be applied to the process.

Additionally, the catalyst island 802 may stay at the tips of the growing carbon nanotube 902 during growth, or remain at the base of the growing carbon nanotube 902, depending on the adhesion between the catalyst island 802 and the substrate 610. In the embodiment, the catalyst island 802 remains at the base 904.

Figure 10:
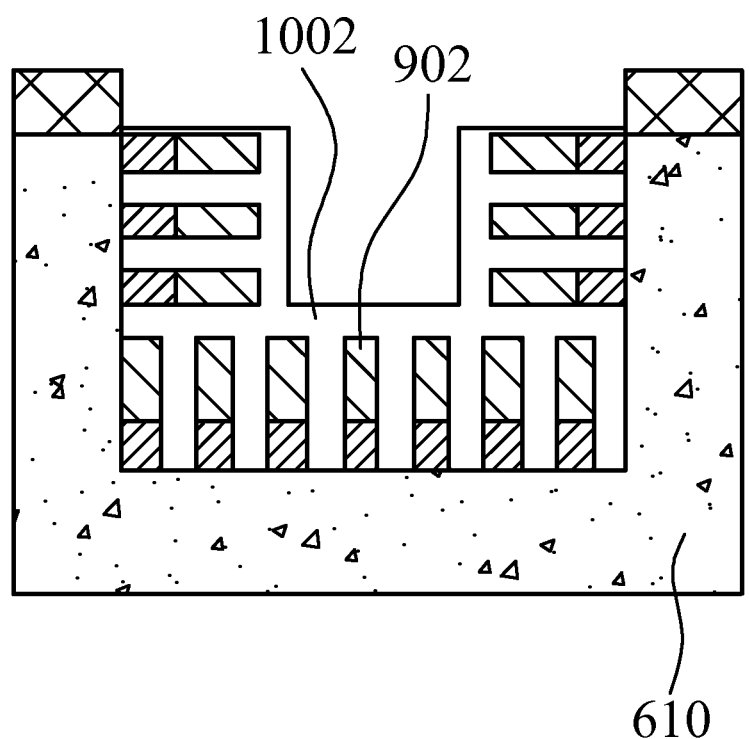
FIG. 10 is a sectional view illustrating the exemplar MEMS device in accordance with some embodiments.

FIG. 10 is a sectional view illustrating the exemplar MEMS device in accordance with some embodiments. As shown in FIG. 10, a getter layer 1002 is formed over the carbon nanotube 902 and the substrate 610. The getter layer 1002 may be made of titanium.

Figure 11:
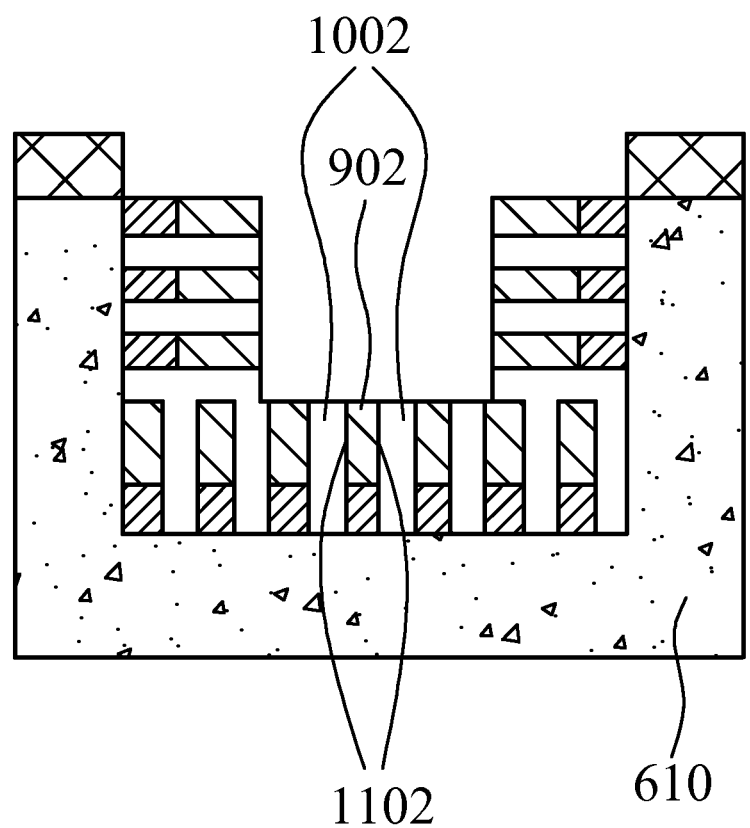
FIG. 11 is a sectional view illustrating the exemplar MEMS device in accordance with some embodiments.

FIG. 11 is a sectional view illustrating the exemplar MEMS device in accordance with some embodiments. As shown in FIG. 11, the getter layer 1002 is etched back to expose the carbon nanotube 902. Therefore, a sidewall 1102 of the getter layer 1002 is made well-ventilated so as to increase surface area and efficiency of the getter layer 1002. We estimate that surface area and getter efficiency of the getter layer 1002 substantially multiplies by about 2-10 times compared to the getter layer being directed deposited over the substrate 610 without carbon nanotube 902 therebetween.

Figure 12:
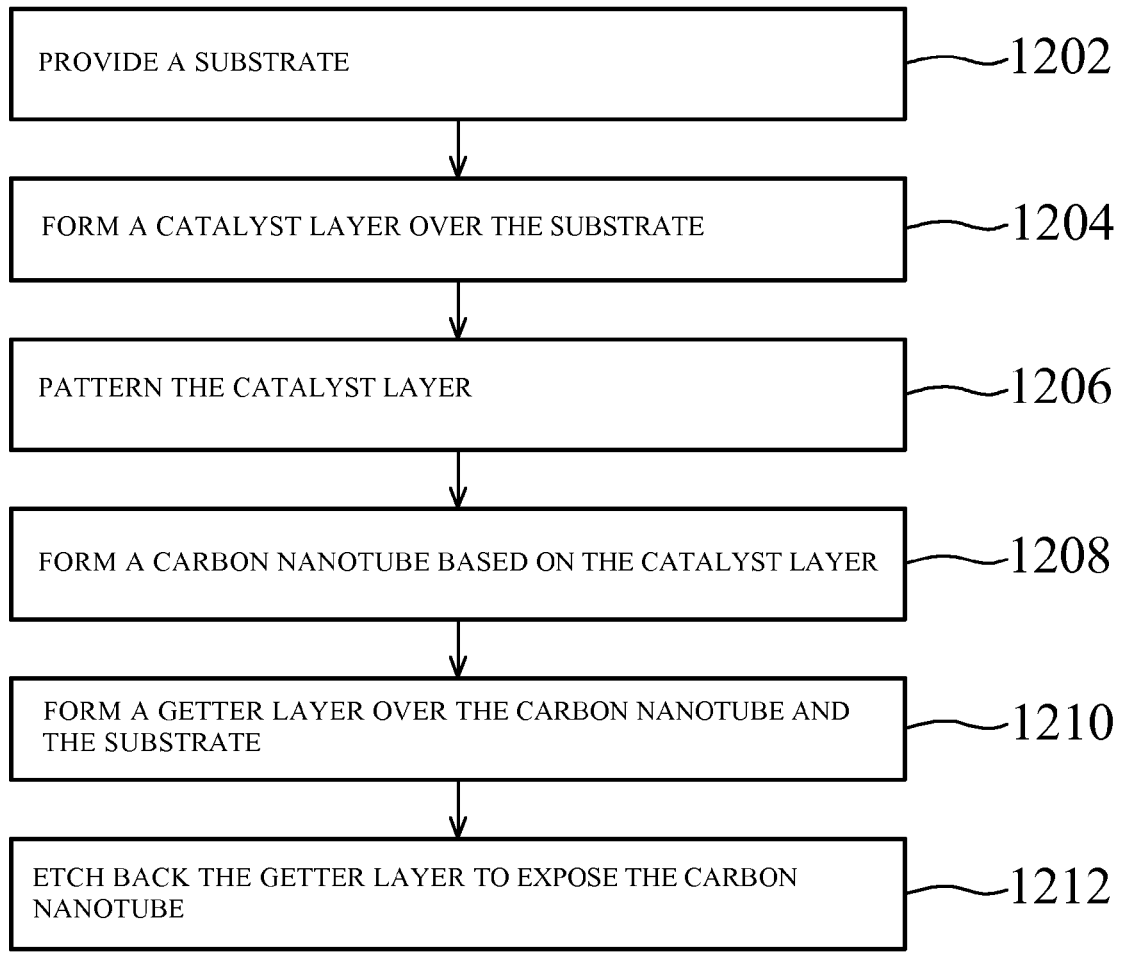
FIG. 12 is a flow chart for a method forming a MEMS device in accordance with some embodiments.

FIG. 12 is a flow chart for a method forming a MEMS device in accordance with some embodiments. As shown in FIG. 12, a method 1200 is provided. The method 1200 includes the following operations: providing a substrate (1202); forming a catalyst layer over the substrate (1204); patterning the catalyst layer (1206); forming a carbon nanotube based on the catalyst layer (1208); forming a getter layer over the carbon nanotube and the substrate (1210); and etching back the getter layer to expose the carbon nanotube (1212).

In the embodiment, the operation 1208 further includes heating the substrate and the catalyst layer; and contacting the catalyst layer with a carbon-containing gas to form the carbon nanotube. The operation of contacting the catalyst layer with the carbon-containing gas further includes contacting the catalyst layer with methane and hydrogen gas. The operation 1204 further includes forming the catalyst layer made of at least one of iron, cobalt and nickel. The operation 1210 further includes forming the getter layer by using titanium. The operation 1212 further includes exposing the carbon nanotube to make a sidewall of the getter layer well-ventilated. The operation 1204 further includes forming the carbon nanotube by chemical vapor deposition. The method 1200 further includes forming a cavity having a bottom surface and a sidewall in the substrate. The operation of forming the catalyst layer over the substrate further includes forming the catalyst layer over the bottom surface. The operation of forming the catalyst layer over the substrate further includes forming the catalyst layer over the sidewall.

Figure 13:
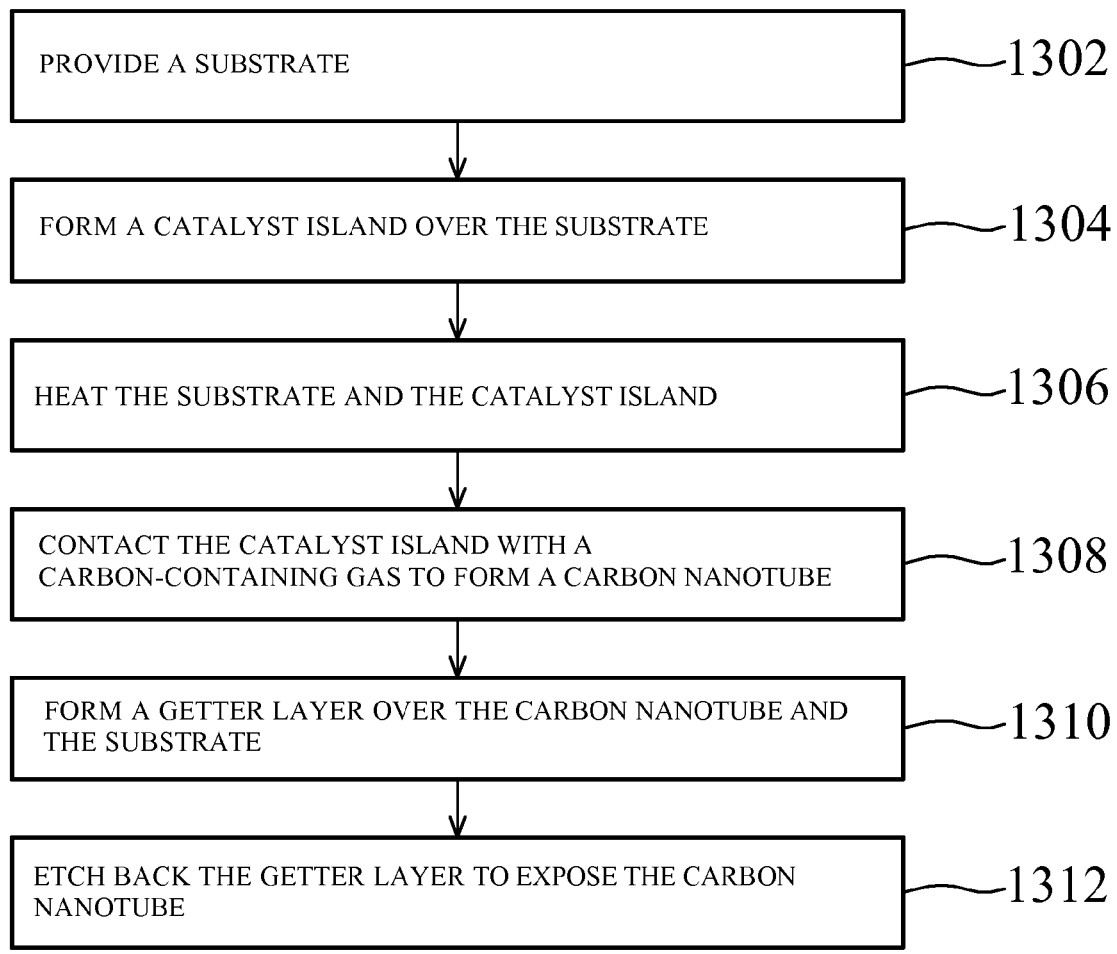
FIG. 13 is a flow chart for a method forming a MEMS device in accordance with some embodiments.

FIG. 13 is a flow chart for a method forming a MEMS device in accordance with some embodiments. As shown in FIG. 13, a method 1300 is provided. The method 1300 includes the following operations: providing a substrate (1302); forming a catalyst island over the substrate (1304); heating the substrate and the catalyst island (1306); contacting the catalyst island with a carbon-containing gas to form a carbon nanotube (1308); forming a getter layer over the carbon nanotube and the substrate (1310); and etching back the getter layer to expose the carbon nanotube (1312).

In the embodiment, the operation 1304 further includes forming a catalyst layer over the substrate; and patterning the catalyst layer. The operation 1308 further includes contacting the catalyst layer with methane and hydrogen gas. The operation 1304 further includes forming the catalyst layer made of at least one of iron, cobalt and nickel. The operation 1310 further includes forming the getter layer by using titanium. The operation 1312 further includes exposing the carbon nanotube to make a sidewall of the getter layer well-ventilated. The operation 1308 further includes forming the carbon nanotube by chemical vapor deposition.

According to an exemplary embodiment, a method of forming a MEMS device is provided. The method includes the following operations: providing a substrate; forming a catalyst layer over the substrate; patterning the catalyst layer; forming a carbon nanotube based on the catalyst layer; forming a getter layer over the carbon nanotube and the substrate; and etching back the getter layer to expose the carbon nanotube.

According to an exemplary embodiment, a method of forming a MEMS device is provided. The method includes the following operations: providing a substrate; forming a catalyst island over the substrate; heating the substrate and the catalyst island; contacting the catalyst island with a carbon-containing gas to form a carbon nanotube; forming a getter layer over the carbon nanotube and the substrate; and etching back the getter layer to expose the carbon nanotube.

According to an exemplary embodiment, a MEMS device is provided. The device includes: a substrate; a plurality of carbon nanotubes over the substrate; and a getter layer among the carbon nanotubes and over the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a Micro Electro Mechanical System (MEMS) device, comprising:
providing a substrate;
forming a catalyst layer over the substrate;
patterning the catalyst layer;
forming a carbon nanotube based on the catalyst layer;

forming a getter layer over the carbon nanotube and the substrate; and etching back the getter layer to expose the carbon nanotube.

2. The method of claim 1, wherein forming the carbon nanotube based on the catalyst layer further comprises:

heating the substrate and the catalyst layer; and exposing the catalyst layer with a carbon-containing gas to form the carbon nanotube.

3. The method of claim 2, wherein contacting the catalyst layer with the carbon-containing gas further comprises contacting the catalyst layer with methane and hydrogen gas.

4. The method of claim 1, wherein forming the catalyst layer over the substrate further comprises forming the catalyst layer made of at least one of iron, cobalt and nickel.

5. The method of claim 1, wherein forming the getter layer over the carbon nanotube and the substrate further comprises forming the getter layer with titanium.

6. The method of claim 1, wherein etching back the getter layer to expose the carbon nanotube further comprises exposing the carbon nanotube to make a sidewall of the getter layer well-ventilated.

7. The method of claim 1, wherein forming the carbon nanotube based on the catalyst layer comprises forming the carbon nanotube by chemical vapor deposition.

8. The method of claim 1, further comprising forming a cavity having a bottom surface and a sidewall in the substrate.

9. The method of claim 8, wherein forming the catalyst layer over the substrate further comprises forming the catalyst layer over the bottom surface.

10. The method of claim 8, wherein forming the catalyst layer over the substrate further comprises forming the catalyst layer over the sidewall.

11. A method of forming a Micro Electro Mechanical System (MEMS) device, comprising:

providing a substrate;

forming a catalyst island over the substrate;

heating the substrate and the catalyst island;

contacting the catalyst island with a carbon-containing gas to form a carbon nanotube;

forming a getter layer over the carbon nanotube and the substrate; and etching back the getter layer to expose the carbon nanotube.

12. The method of claim 11, wherein forming the catalyst island over the substrate further comprises:

forming a catalyst layer over the substrate; and patterning the catalyst layer to form the catalyst island having a size of about 100 nanometers to about 5 micrometers.

13. The method of claim 11, wherein contacting the catalyst layer with the carbon-containing gas further comprises contacting the catalyst layer with methane and hydrogen gas.

14. The method of claim 11, wherein forming the catalyst layer over the substrate further comprise forming the catalyst layer made of at least one of iron, cobalt and nickel.

15. The method of claim 11, wherein forming the getter layer over the carbon nanotube and the substrate further comprises forming the getter layer by using titanium.

16. The method of claim 11, wherein etching back the getter layer to expose the carbon nanotube further comprises exposing the carbon nanotube to make a sidewall of the getter layer well-ventilated.

17. The method of claim 11, wherein contacting the catalyst island with the carbon-containing gas to form the carbon nanotube further comprises forming the carbon nanotube having a length of about 100 nanometers to about 5 micrometers by chemical vapor deposition.

18. A MEMS device, comprising:

a substrate;

a plurality of carbon nanotubes arranged substantially abreast one another over the substrate; and a getter layer disposed on the substrate and interposing the carbon nanotubes.

19. The device of claim 18, where the substrate has a cavity with defined by a bottom surface and a sidewall.

20. The device of claim 19, wherein the carbon nanotubes are disposed over the bottom surface and the sidewall.

\* \* \* \* \*